(12) United States Patent
Tam et al.

(10) Patent No.: US 10,130,958 B2
(45) Date of Patent: Nov. 20, 2018

(54) SHOWERHEAD ASSEMBLY WITH GAS INJECTION DISTRIBUTION DEVICES

(75) Inventors: Alexander Tam, Union City, CA (US); Anzhong Chang, Sane Jose, CA (US); Sumedh Acharya, Pune (IN)

(73) Assignee: APPLIED MATERIALS, INC., Santa Clara, CA (US)

(*) Notice: Subject to any disclaimer, the term of this patent is extended or adjusted under 35 U.S.C. 154(b) by 1214 days.

(21) Appl. No.: 12/856,747

(22) Filed: Aug. 16, 2010

(65) Prior Publication Data
US 2011/0256315 A1 Oct. 20, 2011

Related U.S. Application Data (60) Provisional application No. 61/324,271, filed on Apr. 14, 2010.

(51) Int. Cl.
*C23C 16/455* (2006.01)
*B05B 1/18* (2006.01)
(Continued)

(52) U.S. Cl.
CPC .......... *B05B 1/18* (2013.01); *C23C 16/45519* (2013.01); *C23C 16/45565* (2013.01);
(Continued)

(58) Field of Classification Search
CPC ........ C23C 16/45563; C23C 16/45565; C23C 16/45568; C23C 16/4557;
(Continued)

(56) References Cited

U.S. PATENT DOCUMENTS

| 1,373,188 | A | * | 3/1921 | Goewey ........................ 411/342 |
| 4,851,295 | A | | 7/1989 | Brors |
| D329,839 | S | | 9/1992 | Ehrhart |
| 5,273,588 | A | | 12/1993 | Foster et al. |
| 5,348,911 | A | | 9/1994 | Jurgensen et al. |

(Continued)

FOREIGN PATENT DOCUMENTS

| CN | 1423834 | 6/2003 |
| CN | 101413112 A | 4/2009 |

(Continued)

OTHER PUBLICATIONS

"Orifice" Merriam-Webster. http://www.merriam-webster.com/dictionary/orifice. Accessed Jul. 15, 2013.*

(Continued)

*Primary Examiner* — Yuechuan Yu
(74) *Attorney, Agent, or Firm* — Patterson + Sheridan LLP (57) ABSTRACT

A method and apparatus that may be utilized for chemical vapor deposition and/or hydride vapor phase epitaxial (HVPE) deposition are provided. The apparatus includes a showerhead assembly with separate inlets and manifolds for delivering separate processing gases into a processing volume of the chamber without mixing the gases prior to entering the processing volume. The showerhead includes a plurality of gas distribution devices disposed within a plurality of gas inlets for injecting one of the processing gases into and distributing it across a manifold for uniform delivery into the processing volume of the chamber. Each of the gas distribution devices preferably has a nozzle configured to evenly distribute the processing gas flowing therethrough while minimizing recirculation of the processing gas within the manifold. As a result, improved deposition uniformity is achieved on a plurality of substrates positioned in the processing volume of the processing chamber.

15 Claims, 4 Drawing Sheets

(51) Int. Cl.
*C23C 16/52* (2006.01)
*C30B 25/14* (2006.01)
*H01L 21/67* (2006.01)

(52) U.S. Cl.
CPC .............. *C23C 16/52* (2013.01); *C30B 25/14* (2013.01); *H01L 21/67115* (2013.01)

(58) Field of Classification Search
CPC ........ C23C 16/45572; C23C 16/45574; C23C 16/45576; C23C 16/4558; C23C 16/45582; C23C 16/45585; C23C 16/45587; C23C 16/45591; C23C 16/45519; C23C 16/52; C30B 25/54; H01L 21/67115; B05B 1/18
See application file for complete search history.

(56) References Cited

U.S. PATENT DOCUMENTS

| | | | |
|---|---|---|---|
| 5,614,023 A * | 3/1997 | Takahashi et al. | 118/410 |
| 5,643,394 A * | 7/1997 | Maydan et al. | 156/345.33 |
| 5,647,911 A | 7/1997 | Vanell et al. | |
| 5,667,592 A | 9/1997 | Boitnott et al. | |
| 5,715,361 A | 2/1998 | Moslehi | |
| 5,762,755 A | 6/1998 | McNeilly et al. | |
| 5,814,239 A | 9/1998 | Kaneko et al. | |
| 5,855,675 A | 1/1999 | Doering et al. | |
| 5,858,471 A | 1/1999 | Ray et al. | |
| 5,871,586 A | 2/1999 | Crawley et al. | |
| 5,950,925 A * | 9/1999 | Fukunaga et al. | 239/132.3 |
| 6,086,673 A | 7/2000 | Molnar | |
| 6,156,581 A | 12/2000 | Vaudo et al. | |
| 6,200,893 B1 | 3/2001 | Sneh | |
| 6,206,972 B1 | 3/2001 | Dunham | |
| 6,270,569 B1 | 8/2001 | Shibata et al. | |
| 6,274,495 B1 | 8/2001 | Omstead et al. | |
| 6,302,964 B1 | 10/2001 | Umotoy et al. | |
| 6,305,314 B1 | 10/2001 | Sneh et al. | |
| 6,309,465 B1 | 10/2001 | Jurgensen et al. | |
| 6,334,983 B1 * | 1/2002 | Okayama et al. | 422/186.29 |
| 6,387,182 B1 | 5/2002 | Horie et al. | |
| 6,444,039 B1 * | 9/2002 | Nguyen | 118/715 |
| 6,451,119 B2 | 9/2002 | Sneh et al. | |
| 6,451,695 B2 | 9/2002 | Sneh | |
| 6,451,713 B1 | 9/2002 | Tay et al. | |
| 6,464,843 B1 | 10/2002 | Wicker et al. | |
| 6,475,910 B1 | 11/2002 | Sneh | |
| 6,492,625 B1 | 12/2002 | Boguslavskiy et al. | |
| 6,503,330 B1 | 1/2003 | Sneh et al. | |
| 6,508,197 B1 | 1/2003 | Omstead et al. | |
| 6,528,394 B1 | 3/2003 | Lee et al. | |
| 6,540,838 B2 | 4/2003 | Sneh et al. | |
| 6,551,399 B1 | 4/2003 | Sneh et al. | |
| 6,562,720 B2 | 5/2003 | Thilderkvist et al. | |
| 6,562,730 B2 | 5/2003 | Jeng et al. | |
| 6,569,765 B1 | 5/2003 | Solomon et al. | |
| 6,586,886 B1 | 7/2003 | Katz et al. | |
| 6,602,784 B2 | 8/2003 | Sneh | |
| 6,616,766 B2 | 9/2003 | Dunham | |
| 6,616,870 B1 | 9/2003 | Goela et al. | |
| 6,630,401 B2 | 10/2003 | Sneh | |
| 6,638,859 B2 | 10/2003 | Sneh et al. | |
| 6,638,862 B2 | 10/2003 | Sneh | |
| 6,660,083 B2 | 12/2003 | Tsvetkov et al. | |
| 6,733,591 B2 | 5/2004 | Anderson | |
| 6,849,241 B2 | 2/2005 | Dauelsberg et al. | |
| 6,883,733 B1 * | 4/2005 | Lind | 239/424 |
| 6,884,296 B2 | 4/2005 | Basceri et al. | |
| 6,897,119 B1 | 5/2005 | Sneh et al. | |
| 6,902,990 B2 | 6/2005 | Gottfried et al. | |
| 6,905,547 B1 | 6/2005 | Londergan et al. | |
| 6,921,437 B1 | 7/2005 | DeDontney et al. | |
| 6,927,426 B2 | 8/2005 | Matsuoka et al. | |
| 6,962,624 B2 | 11/2005 | Jurgensen et al. | |
| 6,964,876 B2 | 11/2005 | Heuken | |
| 6,972,050 B2 | 12/2005 | Bremser et al. | |
| 6,983,620 B2 | 1/2006 | Kaeppeler | |
| 7,018,940 B2 | 3/2006 | Dunham | |
| 7,033,921 B2 | 4/2006 | Jurgensen | |
| 7,078,318 B2 | 7/2006 | Jurgensen et al. | |
| 7,103,443 B2 | 9/2006 | Strang | |
| 7,115,896 B2 | 10/2006 | Guo et al. | |
| 7,128,785 B2 | 10/2006 | Kaeppeler et al. | |
| 7,147,718 B2 | 12/2006 | Jurgensen et al. | |
| 7,275,861 B2 | 10/2007 | Volf et al. | |
| 7,364,991 B2 | 4/2008 | Bour et al. | |
| 7,368,368 B2 | 5/2008 | Emerson | |
| 7,410,676 B2 | 8/2008 | Kim et al. | |
| 7,452,125 B2 | 11/2008 | Volf et al. | |
| 7,625,448 B2 | 12/2009 | Dauelsberg et al. | |
| 7,682,940 B2 | 3/2010 | Ye et al. | |
| 2001/0010207 A1 * | 8/2001 | Yamamoto et al. | 118/723 MW |
| 2001/0050059 A1 | 12/2001 | Hongo et al. | |
| 2001/0052322 A1 * | 12/2001 | Hirayama et al. | 118/723 MW |
| 2002/0008480 A1 * | 1/2002 | Yamazaki et al. | 315/111.21 |
| 2002/0017243 A1 | 2/2002 | Pyo | |
| 2002/0092471 A1 | 7/2002 | Kang et al. | |
| 2003/0019428 A1 * | 1/2003 | Ku et al. | 118/715 |
| 2003/0116087 A1 * | 6/2003 | Nguyen et al. | 118/715 |
| 2003/0172872 A1 * | 9/2003 | Thakur et al. | 118/715 |
| 2004/0221809 A1 | 11/2004 | Ohmi et al. | |
| 2005/0109460 A1 * | 5/2005 | DeDontney et al. | 156/345.33 |
| 2005/0118737 A1 * | 6/2005 | Takagi | H01J 37/3244 438/14 |
| 2006/0021568 A1 * | 2/2006 | Matsumoto | 118/62 |
| 2006/0021574 A1 * | 2/2006 | Armour et al. | 118/715 |
| 2006/0154455 A1 | 7/2006 | Guo et al. | |
| 2006/0196603 A1 * | 9/2006 | Lei et al. | 156/345.33 |
| 2006/0205199 A1 | 9/2006 | Baker et al. | |
| 2007/0010033 A1 | 1/2007 | Aderhold et al. | |
| 2007/0157986 A1 * | 7/2007 | Lammers | 138/40 |
| 2007/0259502 A1 | 11/2007 | Bour et al. | |
| 2008/0050889 A1 | 2/2008 | Bour et al. | |
| 2008/0099147 A1 * | 5/2008 | Myo et al. | 156/345.34 |
| 2008/0206464 A1 | 8/2008 | Kappeler | |
| 2008/0264337 A1 * | 10/2008 | Sano | C23C 16/4408 118/704 |
| 2009/0095221 A1 | 4/2009 | Tam et al. | |
| 2009/0095222 A1 | 4/2009 | Tam et al. | |
| 2009/0098276 A1 | 4/2009 | Burrows et al. | |
| 2009/0149008 A1 | 6/2009 | Kryliouk et al. | |
| 2009/0194026 A1 | 8/2009 | Burrows et al. | |
| 2009/0211707 A1 | 8/2009 | Chao et al. | |
| 2009/0223930 A1 * | 9/2009 | Kwon et al. | 216/67 |

FOREIGN PATENT DOCUMENTS

| | | |
|---|---|---|
| GB | 2 219 311 | 12/1989 |
| JP | 2234419 | 9/1990 |
| JP | 05152208 A * | 6/1993 |
| JP | 07142401 A * | 6/1995 |
| JP | 2000306889 A * | 11/2000 |
| JP | 2003-124125 | 4/2003 |
| JP | 2004-140328 A | 5/2004 |
| JP | 2004335825 A * | 11/2004 |
| JP | 2007-154297 A | 6/2007 |
| JP | 2008-066490 A | 3/2008 |
| JP | 2008066662 A * | 3/2008 |
| JP | 2008177428 A * | 7/2008 |
| JP | 2010059520 A * | 3/2010 |
| KR | 10-0578089 B1 | 5/2006 |
| KR | 10-2009-0121498 | 11/2009 |
| KR | 10-2010-0004640 | 1/2010 |
| WO | WO-2009099721 A2 | 8/2009 |

OTHER PUBLICATIONS

Bohnen, et al, "Enhanced Growth Rates and Reduced Parasitic Deposition by the Substitution of $Cl_2$ for HCl in GaN HVPE", Journal of Crystal Growth 312 (2010) 2542-2550.

(56) References Cited

OTHER PUBLICATIONS

International Search Report and Written Opinion dated Feb. 10, 2012 for International Application No. PCT/US2011/040335.
International Search Report and Written Opinion dated Feb. 24, 2012 for International Application No. PCT/US2011/043577.
International Search Report and Written Opinion dated Mar. 28, 2012 for International Application No. PCT/US2011/048975.
Chinoy et al., "A Novel Reactor for Large-Area Epitaxial Solar Cell Materials." Solar Cells, 30 (1991) pp. 323-335.
Vernon et al., "Close-Spaced MOCVD Reactor for 1%-Uniformity Growth of In-Containing Materials on 4 Substrates." pp. 137-140, IEEE Xplore.
Office Action, U.S. Appl. No. 11/925,615 dated Nov. 19, 2010.
Motoki, et al. "Preparation of Large Freestanding GaN Substrates by Hydride Vapor Phase Epitaxy Using GaAs as a Starting Substrate", JP Appl. Phys. vol. 40 (2001) pp. L140-L143. Part 2. No. 2B. Feb. 15, 2001.
Kikuchi, et al. "Thermodynamic Analysis of Various Types of Hydride Vapor Phase Epitaxy System for High-Speed Growth of InN", 2006, Japanese Journal of Appiled Physics, vol. 45 No. 45, pp. L1203-L1205.
Kelly, et al. "Large Free-Standing GaN Substrates by Hydride Vapor Phase Epitaxy and Laser-Induced Liftoff", JP Appl. Phys. vol. 38 (1999) pp. L217-L219. Part 2. No, 3A. Mar. 1, 1999.
Park, et al. "Free-Standing GaN Substrates by Hydride Vapor Phase Epitaxy", JP Appl. Phys. vol. 39 (2000) pp. L1141-L1142. Part 2. No. 11B. Nov. 15, 2000.
Ban, Vladimir S. "Mass Spectrometric Studies of Vapor-Phase Crystal Growth", vol. 119, Issue 6. pp. 761-765. Jun. 1972.
International Search Report, PCT/US2010/030492 dated Oct. 27, 2010.
Office Action, U.S. Appl. No. 11/767,520 dated Sep. 8, 2010.
International Search Report, PCT/US2010/032032 dated Nov. 26, 2010.
International Search Report, PCT/US2010/032597 dated Dec. 1, 2010.
International Search Report, PCT/US2010/032313 dated Dec. 6, 2010.
Chinese Office Action for Application No. 200810168234.1 dated Aug. 16, 2010.
Chinese Office Action for Application No. 201180043641.X, dated Mar. 24, 2015.

* cited by examiner

SHOWERHEAD ASSEMBLY WITH GAS INJECTION DISTRIBUTION DEVICES

CROSS-REFERENCE TO RELATED APPLICATIONS

This application claims benefit of U.S. Provisional Patent Application Ser. No. 61/324,271 (APPM/015324L), filed Apr. 14, 2010, which is herein incorporated by reference.

BACKGROUND OF THE INVENTION

Field of the Invention

Embodiments of the present invention generally relate to methods and apparatus for chemical vapor deposition (CVD) on a substrate, and, in particular, to a showerhead design for use in metal organic chemical vapor deposition (MOCVD) and/or hydride vapor phase epitaxy (HVPE).

Description of the Related Art

Group III-V films are finding greater importance in the development and fabrication of a variety of semiconductor devices, such as short wavelength light emitting diodes (LEDs), laser diodes (LDs), and electronic devices including high power, high frequency, high temperature transistors and integrated circuits. For example, short wavelength (e.g., blue/green to ultraviolet) LEDs are fabricated using the Group III-nitride semiconducting material gallium nitride (GaN). It has been observed that short wavelength LEDs fabricated using GaN can provide significantly greater efficiencies and longer operating lifetimes than short wavelength LEDs fabricated using non-nitride semiconducting materials, such as Group II-VI materials.

One method that has been used for depositing Group III-nitrides, such as GaN, is metal organic chemical vapor deposition (MOCVD). This chemical vapor deposition method is generally performed in a reactor having a temperature controlled environment to assure the stability of a first precursor gas which contains at least one element from Group III, such as gallium (Ga). A second precursor gas, such as ammonia ($NH_3$), provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface. The quality of the film depends in part upon deposition uniformity which, in turn, depends upon uniform mixing of the precursors across the substrate.

Multiple substrates may be arranged on a substrate carrier and each substrate may have a diameter ranging from 50 mm to 100 mm or larger. The uniform mixing of precursors over larger substrates and/or more substrates and larger deposition areas is desirable in order to increase yield and throughput. These factors are important since they directly affect the cost to produce an electronic device and, thus, a device manufacturer's competitiveness in the marketplace.

Interaction of the precursor gases with the hot hardware components, which are often found in the processing zone of an LED or LD forming reactor, generally causes the precursor to break-down and deposit on these hot surfaces. Typically, the hot reactor surfaces are formed by radiation from the heat sources used to heat the substrates. The deposition of the precursor materials on the hot surfaces can be especially problematic when it occurs in or on the precursor distribution components, such as the showerhead. Deposition on the precursor distribution components affects the flow distribution uniformity over time. Therefore, there is a need for a gas distribution apparatus that prevents or reduces the likelihood that the MOCVD precursors, or HVPE precursors, are heated to a temperature that causes them to break down and affect the performance of the gas distribution device.

Also, as the demand for LEDs, LDs, transistors, and integrated circuits increases, the efficiency of depositing high quality Group-III nitride films takes on greater importance. Therefore, there is a need for an improved deposition apparatus and process that can provide consistent film quality over larger substrates and larger deposition areas. As a result, there is a need for improved uniformity in gas distribution through the gas distribution device to provide improved uniformity in the film subsequently deposited over the larger substrates and larger deposition areas.

SUMMARY OF THE INVENTION

The present invention generally provides improved methods and apparatus for depositing Group III-nitride films using MOCVD and/or HVPE processes.

One embodiment provides a showerhead assembly comprising a showerhead having a first gas manifold formed in the showerhead, a plurality of first gas conduits extending through the showerhead and fluidly coupling the first gas manifold to an exit surface of the showerhead, and a plurality of gas distribution devices each having an annular orifice formed therein that is in fluid communication with the first gas manifold and configured to be coupled to a gas source.

Another embodiment provides a substrate processing apparatus comprising a chamber body, a substrate support, and a showerhead assembly, wherein a processing volume is defined by the chamber body, the substrate support, and the showerhead assembly. The showerhead assembly comprises a showerhead having a first gas manifold formed in the showerhead, a plurality of first gas conduits extending through the showerhead and fluidly coupling the first gas manifold to the processing volume, and a plurality of gas distribution devices each having an annular orifice that is in fluid communication with the first gas manifold, wherein the plurality of gas distribution devices are configured to be coupled to a single gas source.

Yet another embodiment provides a method of processing substrates comprising introducing a first gas into a processing volume of a processing chamber through one or more gas distribution devices disposed in one or more first gas inlets coupled to a first gas manifold of a showerhead assembly, wherein each gas distribution device has an annular orifice disposed therein and fluidly coupled with the first gas manifold. The method further comprises introducing a second gas into the processing volume of the processing chamber through a second gas inlet coupled to a second gas manifold of the showerhead assembly, wherein the first gas manifold is isolated from the second gas manifold, wherein the first gas is delivered into the processing volume through a plurality of first gas conduits and the second gas is delivered into the processing volume through a plurality of second gas conduits. The method also comprises cooling the showerhead assembly by flowing a heat exchanging fluid through a temperature control manifold disposed in the showerhead assembly, wherein the plurality of first and second gas conduits are disposed through the temperature control manifold.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally provide a method and apparatus that may be utilized for deposition of Group III-nitride films using MOCVD and/or HVPE hardware. Generally, the apparatus is a processing chamber that includes a showerhead with separate inlets and passages for delivering separate processing gases into a processing volume of the chamber without mixing the gases prior to entering the processing volume. The showerhead includes a plurality of gas distribution devices disposed within a plurality of gas inlets for injecting one of the processing gases into and distributing it across a manifold for uniform delivery into the processing volume of the chamber. Each of the gas distribution devices preferably has a nozzle configured to evenly distribute the processing gas flowing therethrough while minimizing recirculation of the processing gas within the manifold.

Figure 1:
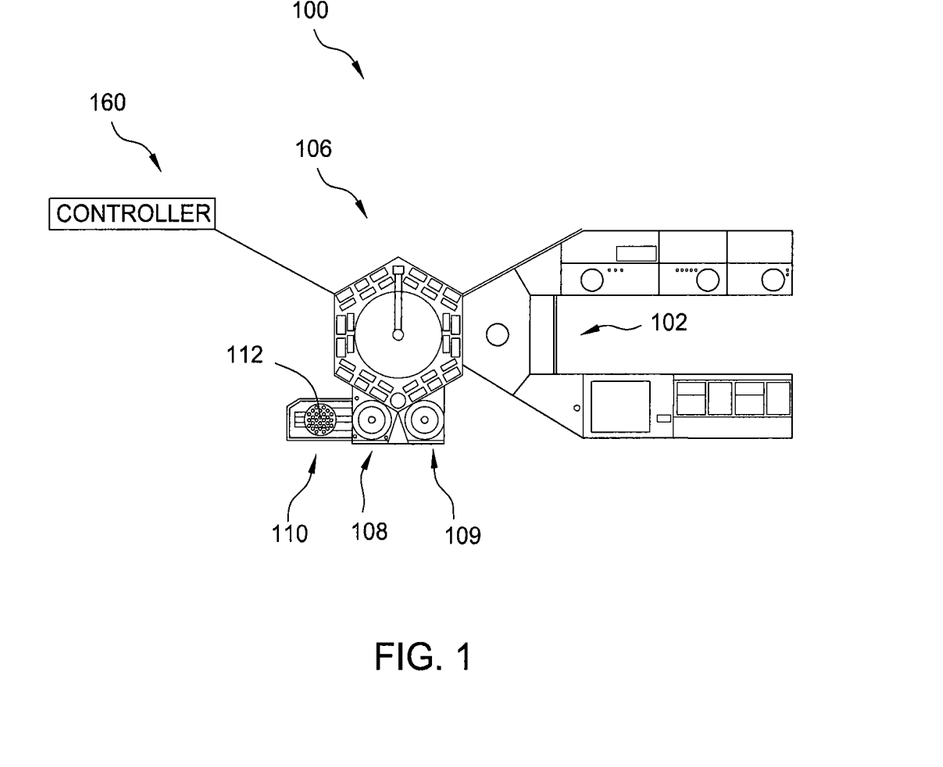
FIG. 1 is a schematic plan view illustrating one embodiment of a processing system for fabricating compound nitride semiconductor devices according to embodiments described herein.

FIG. 1 is a schematic plan view illustrating one embodiment of a processing system 100 that comprises the one or more MOCVD chambers 102 for fabricating compound nitride semiconductor devices according to embodiments described herein. In one embodiment, the processing system 100 is closed to atmosphere. The processing system 100 comprises a transfer chamber 106, a MOCVD chamber 102 coupled with the transfer chamber 106, a loadlock chamber 108 coupled with the transfer chamber 106, a batch loadlock chamber 109, for storing substrates, coupled with the transfer chamber 106, and a load station 110, for loading substrates, coupled with the loadlock chamber 108. The transfer chamber 106 comprises a robot assembly (not shown) operable to pick up and transfer substrates between the loadlock chamber 108, the batch loadlock chamber 109, and the MOCVD chamber 102. Although a single MOCVD chamber 102 is shown, it should be understood that more than one MOCVD chamber 102 or additionally, combinations of one or more MOCVD chambers 102 with one or more Hydride Vapor Phase Epitaxial (HVPE) chambers may also be coupled with the transfer chamber 106. It should also be understood that although a cluster tool is shown, the embodiments described herein may be performed using linear track systems.

In one embodiment, the transfer chamber 106 remains under vacuum during substrate transfer processes to control the amount of contaminants, such as oxygen ($C_2$) or water ($H_2O$), to which the substrates are exposed. The transfer chamber vacuum level may be adjusted to match the vacuum level of the MOCVD chamber 102. For example, when transferring substrates from a transfer chamber 106 into the MOCVD chamber 102 (or vice versa), the transfer chamber 106 and the MOCVD chamber 102 may be maintained at the same vacuum level. Then, when transferring substrates from the transfer chamber 106 to the load lock chamber 108 (or vice versa) or the batch load lock chamber 109 (or vice versa), the transfer chamber vacuum level may be adjusted to match the vacuum level of the loadlock chamber 108 or batch load lock chamber 109 even through the vacuum level of the loadlock chamber 108 or batch load lock chamber 109 and the MOCVD chamber 102 may be different. Thus, the vacuum level of the transfer chamber 106 is adjustable. In certain embodiments, substrates are transferred in a high purity inert gas environment, such as, a high purity $N_2$ environment. In one embodiment, substrates transferred in an environment having greater than 90% $N_2$. In certain embodiments, substrates are transferred in a high purity $NH_3$ environment. In one embodiment, substrates are transferred in an environment having greater than 90% $NH_3$. In certain embodiments, substrates are transferred in a high purity $H_2$ environment. In one embodiment, substrates are transferred in an environment having greater than 90% $H_2$.

In the processing system 100, the robot assembly (not shown) transfers a substrate carrier plate 112 loaded with substrates into the single MOCVD chamber 102 to undergo deposition. As one example, the substrate carrier plate 112 may have a diameter ranging from about 200 mm to about 750 mm. The substrate carrier plate 112 may be formed from a variety of materials, including SiC or SiC-coated graphite. The substrate carrier plate 112 may have a surface area of about 1,000 $cm^2$ or more, preferably 2,000 $cm^2$ or more, and more preferably 4,000 $cm^2$ or more. After some or all deposition steps have been completed, the substrate carrier plate 112 is transferred from the MOCVD chamber 102 back to the loadlock chamber 108 via the transfer robot. The substrate carrier plate 112 can then be transferred to the load station 110. The substrate carrier plate 112 may be stored in either the loadlock chamber 108 or the batch load lock chamber 109 prior to further processing in the MOCVD chamber 102. One exemplary processing system 100 that may be adapted in accordance with embodiments of the present invention is described in U.S. patent application Ser. No. 12/023,572, filed Jan. 31, 2008, now published as US 2009-0194026, entitled PROCESSING SYSTEM FOR FABRICATING COMPOUND NITRIDE SEMICONDUCTOR DEVICES, which is hereby incorporated by reference in its entirety.

A system controller 160 controls activities and operating parameters of the processing system 100. The system controller 160 includes a computer processor and a computer-readable memory coupled to the processor. The processor executes system control software, such as a computer program stored in memory. Exemplary aspects of the processing system 100 and methods of use adaptable to embodiments of the present invention are further described in U.S. patent application Ser. No. 11/404,516, filed Apr. 14, 2006, now published as US 2007-024516, entitled EPITAXIAL GROWTH OF COMPOUND NITRIDE STRUCTURES, which is hereby incorporated by reference in its entirety.

Figure 2:
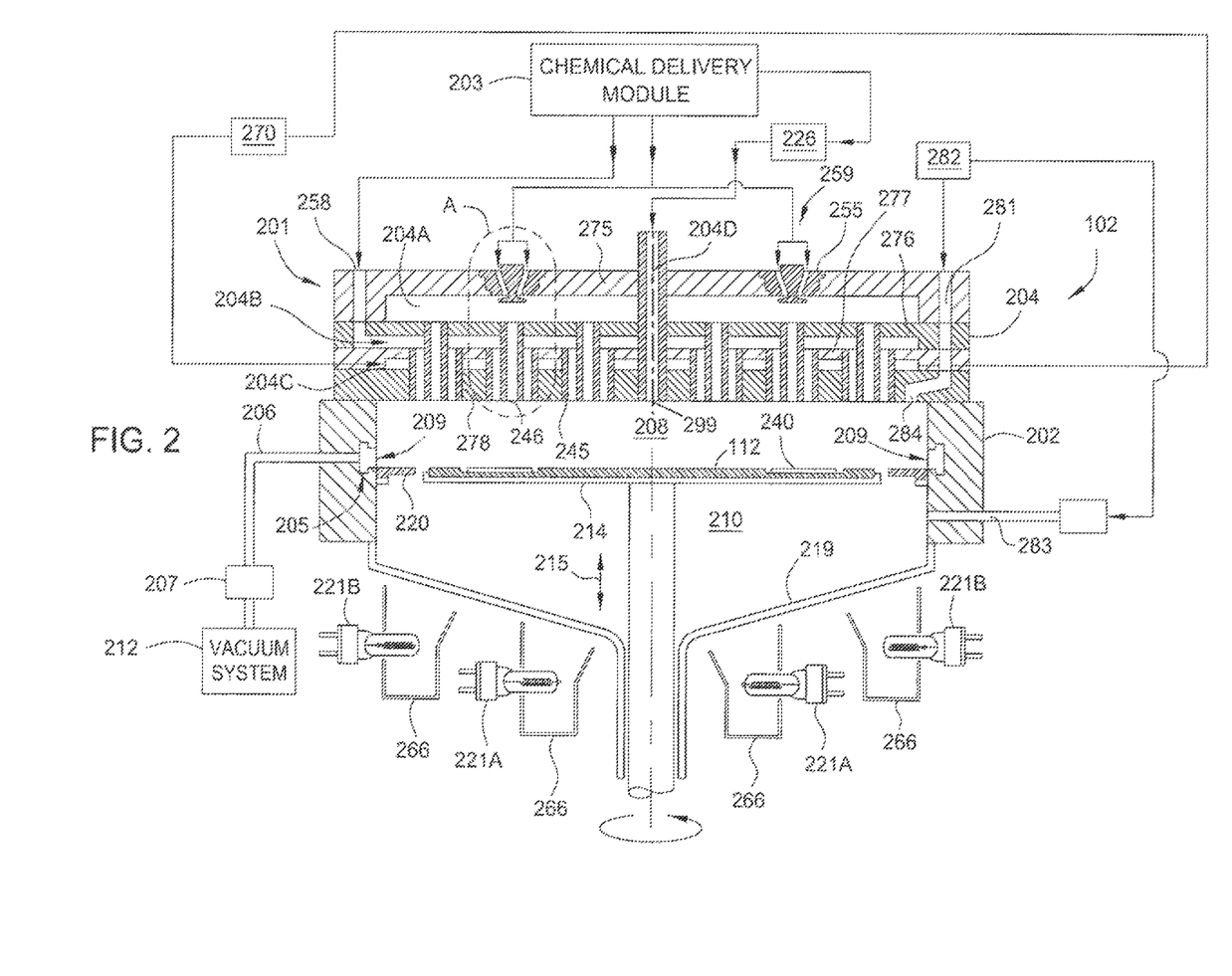
FIG. 2 is a schematic cross-sectional view of a metal-organic chemical vapor deposition (MOCVD) chamber for fabricating compound nitride semiconductor devices according to one embodiment of the present invention.

FIG. 2 is a schematic cross-sectional view of the MOCVD chamber 102 according to one embodiment of the present invention. The MOCVD chamber 102 comprises a chamber body 202, a chemical delivery module 203 for delivering precursor gases, carrier gases, cleaning gases, and/or purge gases, a remote plasma system 226 with a plasma source, a susceptor or substrate support 214, and a vacuum system 212. The chamber body 202 encloses a processing volume 208. A showerhead assembly 201 is disposed at one end of the processing volume 208, and the substrate carrier plate 112 is disposed at the other end of the processing volume 208. The substrate carrier plate 112 may be disposed on the substrate support 214. An actuator assembly is capable of moving the substrate support 214 in a vertical direction toward or away from the showerhead assembly 201, as shown by arrow 215. The actuator assembly may be capable of rotating the substrate support 214. The distance from the surface of the showerhead assembly 201 that is adjacent the processing volume 208 to the substrate carrier plate 112 during processing preferably ranges from about 4 mm to about 41 mm. In certain embodiments, the substrate support 214 comprises a heating element (e.g., a resistive heating element (not shown)) for controlling the temperature of the substrate support 214 and consequently controlling the temperature of the substrate carrier plate 112 and substrates 240 positioned on the substrate carrier plate 112 and the substrate support 214.

The showerhead assembly 201 includes a showerhead 204. In one embodiment, the showerhead 204 includes a plurality of plates machined and attached such that a plurality of manifolds and apertures are formed therein, such as by brazing or welding. The showerhead 204 has a first processing gas manifold 204A coupled with the chemical delivery module 203 via a plurality of first processing gas inlets 259 for delivering a first precursor or first process gas mixture to the processing volume 208. The first processing gas manifold 204A may be formed by machining a volume of material from a surface of a top wall 275 to form a well therein and attaching the top wall 275 to a first horizontal wall 276, such as by brazing or welding. In one embodiment, the chemical delivery module 203 is configured to deliver a metal organic precursor to the first processing gas manifold 204A. In one example, the metal organic precursor comprises a suitable gallium (Ga) precursor (e.g., trimethyl gallium ("TMG"), triethyl gallium (TEG)), a suitable aluminum precursor (e.g., trimethyl aluminum ("TMA")), or a suitable indium precursor (e.g., trimethyl indium ("TMI")).

In one embodiment, a gas distribution device 255 is disposed within each of the first processing gas inlets 259. The gas distribution device 255 is coupled to the chemical delivery module 203 and is configured to uniformly distribute gas received from the chemical delivery module 203 into the first processing gas manifold 204A. The gas distribution device 255 is generally structured to provide uniform gas distribution therethrough while preventing recirculation of the gas within the first processing gas manifold 204A by the configuration of its outlet orifice shape and by controlling the gas flow and pressure. In one embodiment, the plurality of first processing gas inlets 259 and corresponding gas distribution devices 255 are positioned in an array about a centerline 299 of the showerhead assembly 201 which has a central conduit 204D. In other embodiments, the plurality of first processing gas inlets 259 and corresponding gas distribution devices 255 are positioned in other configurations to maximize uniform gas distribution about the first processing gas manifold 204A. The showerhead assembly 201 may include between about four and about twelve gas distribution devices 255. In one embodiment, the showerhead assembly 201 includes between about six and about eight gas distribution devices 255.

The showerhead 204 may have a second processing gas manifold 204B coupled with the chemical delivery module 203 for delivering a second precursor or second process gas mixture to the processing volume 208 via a second processing gas inlet 258. In one embodiment, the chemical delivery module 203 is configured to deliver a suitable nitrogen containing processing gas, such as ammonia ($NH_3$) or other MOCVD or HVPE processing gas, to the second processing gas manifold 204B. The second processing gas manifold 204B is separated from the first processing gas manifold 204A by the first horizontal wall 276 of the showerhead 204. The second processing gas manifold 204B may be formed by machining a volume of material from a surface of the first horizontal wall 276 to form a well therein and attaching the first horizontal wall 276 to the second horizontal wall 277, such as by brazing or welding.

The showerhead 204 may further include a temperature control manifold 204C coupled with a heat exchanging system 270 for flowing a heat exchanging fluid through the showerhead 204 to help regulate the temperature of the showerhead 204. Suitable heat exchanging fluids include, but are not limited to, water, water-based ethylene glycol mixtures, a perfluoropolyether (e.g., Galden® fluid), oil-based thermal transfer fluids, or similar fluids. The second processing gas manifold 204B is separated from the temperature control manifold 204C by a second horizontal wall 277 of the showerhead 204. The temperature control manifold 204C may be separated from the processing volume 208 by a third horizontal wall 278 of the showerhead 204. The temperature control manifold 204C may be formed by machining a volume of material from a surface of the second horizontal wall 277 to form a well therein and attaching the second horizontal wall 277 to the third horizontal wall 278, such as by brazing or welding.

Figure 3:
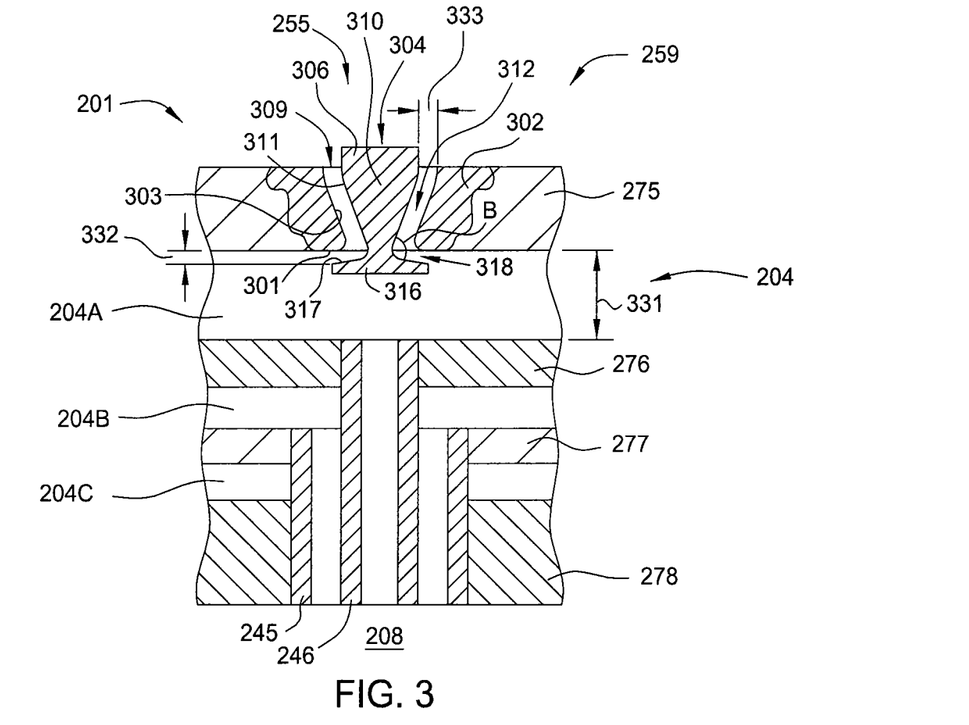
FIG. 3 is an enlarged view of detail A shown in FIG. 2.
Figure 4:
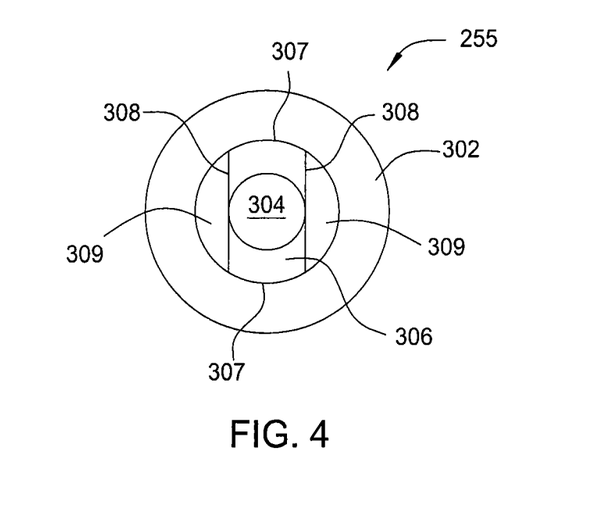
FIG. 4 is a top view of a gas distribution device depicted in FIGS. 2 and 3 according to one embodiment.

FIG. 3 is an enlarged view of detail A shown in FIG. 2, and FIG. 4 is a top view of the gas distribution device 255 depicted in FIG. 3. Referring to FIGS. 2, 3, and 4, in one embodiment, the first precursor or first processing gas mixture, such as a metal organic precursor, is delivered from the chemical delivery module 203 into the first processing gas manifold 204A through the plurality of first processing gas inlets 259 disposed through the top wall 275 of the showerhead 204 via the plurality of gas distribution devices 255.

Each of the gas distribution devices 255 generally includes a cylindrical body portion 302 and a central portion 304 attached to the cylindrical body portion 302. The central portion 304 may include a gas receiving portion 306 and a gas distribution portion 316 with a frustoconical portion 310 extending therebetween. The gas receiving portion 306 generally has an inverted frustoconical shape with its perimeter attached to the cylindrical body portion 302 on a first set of opposing sides 307 (FIG. 4), and its perimeter truncated on opposing sides 308, such that upper gas passages 309 are formed between the gas receiving portion 306 and the cylindrical body portion 302.

The frustoconical portion 310 extends downwardly from the gas receiving portion 306 and into the first processing gas manifold 204A. The cylindrical body portion 302 has an inner surface 303 that approximately mimics the shape of the surface 311 of the frustoconical portion 310, such that an annular gas passage 312 is formed between the cylindrical body portion 302 and the frustoconical portion 310. The gas distribution portion 316 is in the general shape of a disc and is positioned at a lower end of the frustoconical portion 310 within the first processing gas manifold 204A, such that an annular orifice 318 is formed between an upper surface 317 of the gas distribution portion 316 and a lower surface 301 of the cylindrical body portion 302.

The frustonconical portion 310 and the gas distribution portion 316 are positioned with respect to one another such that an angle B is formed between the surface 311 of the frustoconical portion 310 and the upper surface 317 of the gas distribution portion 316. The angle B may be between about 45 degrees and about 75 degrees. In one example, the angle B is about 60 degrees.

In operation, the first precursor or first processing gas mixture is delivered from the chemical delivery module 203 to the gas distribution device 255. The gas flows across the gas receiving portion 306 and through the upper gas passages 309 into the annular gas passage 312 between the frustoconical portion 310 and the body portion 302. The gas then flows through the annular gas passage 312, through the annular orifice 318 between the gas distribution portion 316 and the body portion 302, and into the first processing gas manifold 204A. Because of the respective shapes and positions of the portions of the gas distribution device 255, the processing gas is delivered through the gas distribution device 255 and into the first processing gas manifold 204A uniformly, without recirculation of the gas at the injection points within the first processing gas manifold 204A. Additionally, as previously described, the number and position of the plurality of gas distribution devices 255 provide uniform gas distribution from the chemical delivery module 203 into the first processing gas manifold 204A.

The first precursor or first processing gas mixture, such as a metal organic precursor, may be delivered from the first processing gas manifold 204A through the second processing gas manifold 204B and the temperature control manifold 204C into the processing volume 208 via a plurality of inner gas conduits 246. The inner gas conduits 246 may be cylindrical tubes located within aligned holes disposed through the first horizontal wall 276, the second horizontal wall 277, and the third horizontal wall 278 of the showerhead 204. In one embodiment, the inner gas conduits 246 are each attached to the first horizontal wall 276 of the showerhead 204 by suitable means, such as brazing.

Figure 5:
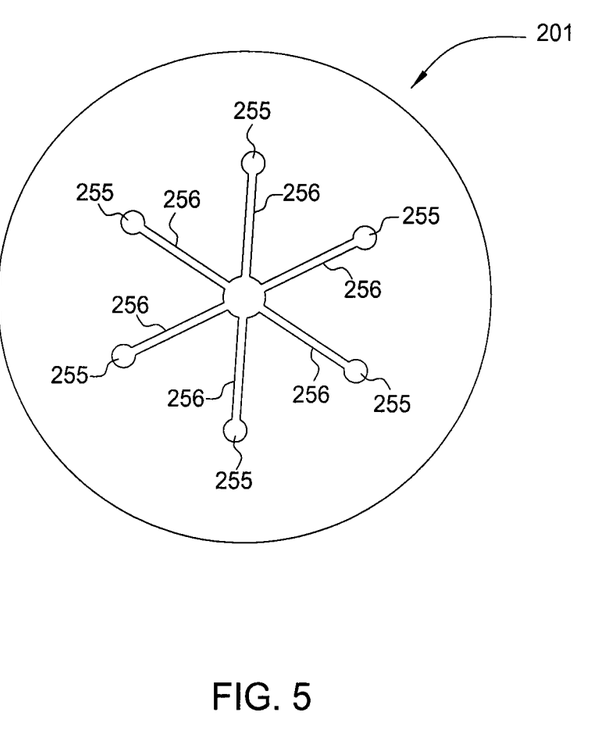
FIG. 5 is a schematic top view of a showerhead assembly illustrated in FIG. 2 according to one embodiment.

During processing, a first precursor gas, such as a metal organic precursor, may be uniformly delivered into the processing volume 208 by evenly distributing the first precursor gas within the first processing gas manifold 204A by use of an array of the gas distribution devices 255. In one example, as illustrated in FIG. 5, the array of gas distribution devices 255 includes six radially positioned gas distribution devices 255 positioned in an array about the center of the showerhead assembly 201. Each of the gas distribution devices 255 are fluidly interconnected by a plurality of gas conduits 256, all of which are connected to the chemical delivery module 203. FIG. 5 is a top view of the showerhead assembly 201 illustrated in FIG. 2 according to one embodiment. A precursor gas flow control device (not shown) within the chemical delivery module 203 is configured to provide an evenly distributed flow of precursor gas to each of the gas distribution devices 255. The flow control device may include separate flow controllers that are each able to adjust the flow and/or pressure of the precursor gas delivered to each of the gas distribution devices 255. In one configuration, the precursor gas flow control device comprises one or more mass flow controllers (not shown).

In one example, during processing, a flow of between about 5 sccm/l and about 15 sccm/l of TMG precursor is delivered through the showerhead assembly 201 via the inner gas conduits 246 into the processing volume 208 that is maintained at a pressure between about 100 Torr and about 500 Torr. The showerhead assembly 201 may include between about 4700 and about 6700 inner gas conduits 246, each having a diameter of between about 0.4 mm and about 0.8 mm. In this example, the uniformly distributed flow of the TMG precursor to the inner gas conduits 246 is achieved by delivering a flow of the TMG precursor to each of the gas distribution devices 255 (FIG. 5), which evenly deliver the TMG precursor into the first processing gas manifold 204A and the inner gas conduits 246. Due to the size and shape of the passages formed in the gas distribution devices 255, the flow of the precursor gas can be uniformly delivered and controlled. In one embodiment, the height 331 (FIG. 3) of the first processing gas manifold 204A is about between about 0.15 in and about 0.25 in, the width 332 (FIG. 3) of the annular orifice 318 is between about 1 mm and about 3 mm, and the width 333 of the annular gas passage 312 is between about 1 mm and about 3 mm.

The second precursor or second processing gas mixture, such as a nitrogen precursor, may be delivered from the second processing gas manifold 204B through the temperature control manifold 204C and into the processing volume 208 via a plurality of outer gas conduits 245. The outer gas conduits 245 may be cylindrical tubes each located concentrically about a respective inner gas conduit 246. The outer gas conduits 245 are located within the aligned holes disposed through the second horizontal wall 277 and the third horizontal wall 278 of the showerhead 204. In one embodiment, the outer gas conduits 245 are each attached to the second horizontal wall 277 of the showerhead 204 by suitable means, such as brazing.

As previously described, the MOCVD chamber 102 may be used for deposition of Group III-nitride films. Generally, the Group III-nitride films are deposited at a temperature exceeding about 550° C. During processing, a cooling fluid is circulated through the temperature control manifold 204C in order to cool the showerhead 204, and in particular, to cool the metal organic precursor being delivered through the inner gas conduits 246, which extend through the temperature control manifold 204C, to prevent decomposition of the metal organic precursor before it is introduced into the processing volume 208. Additionally, it is believed that surrounding the metal organic precursor flowing through each inner gas conduit 246 with a flow of nitrogen-containing gas through the second processing gas manifold 204B and each outer gas conduit 245, provides additional cooling and thermal insulation from the high processing temperatures within the processing volume 208, in order to prevent decomposition of the metal organic precursor before it is introduced into the processing volume 208. Moreover, as a result of the uniform gas distribution within the first processing gas manifold 204A, as described above, the metal organic precursor may be distributed more evenly into the processing volume 208 of the chamber 102, resulting in more even deposition of Group III-nitride films on the substrates 240.

Referring back to FIG. 2, a lower dome 219 is disposed at one end of a lower volume 210, and the substrate carrier plate 112 is disposed at the other end of the lower volume 210. The substrate carrier plate 112 is shown in an elevated, process position, but may be moved to a lower position where, for example, the substrates 240 may be loaded or unloaded. An exhaust ring 220 may be disposed around the periphery of the substrate carrier plate 112 to help prevent deposition from occurring in the lower volume 210 and also help direct exhaust gases from the chamber 102 to exhaust ports 209. The lower dome 219 may be made of transparent material, such as high-purity quartz, to allow light to pass through for radiant heating of the substrates 240. The radiant heating may be provided by a plurality of inner lamps 221A and outer lamps 221B disposed below the lower dome 219. Reflectors 266 may be used to help control exposure of the chamber 102 to the radiant energy provided by the inner and outer lamps 221A, 221B. Additional rings of lamps (not shown) may also be used for finer temperature control of the substrates 240.

In certain embodiments of the present invention, a purge gas (e.g., a nitrogen containing gas) is delivered into the chamber 102 from the showerhead 204 through one or more purge gas channels 281 coupled to a purge gas source 282. In this embodiment, the purge gas is distributed through a plurality of orifices 284 about the periphery of the showerhead 204. The plurality of orifices 284 may be configured in a circular pattern about the periphery of the showerhead 204 and positioned distribute the purge gas about the periphery of the substrate carrier plate 112 to prevent undesirable deposition on edges of the substrate carrier plate 112, the showerhead 204, and other components of the chamber 102, which result in particle formation and, ultimately contamination of the substrates 240. The purge gas flows downwardly into multiple exhaust ports 209, which are disposed around an annular exhaust channel 205. An exhaust conduit 206 connects the annular exhaust channel 205 to a vacuum system 212, which includes a vacuum pump 207. The pressure of the chamber 102 may be controlled using a valve system, which controls the rate at which the exhaust gases are drawn from the annular exhaust channel 205.

In other embodiments, purge gas tubes 283 are disposed near the bottom of the chamber body 202. In this configuration, the purge gas enters the lower volume 210 of the chamber 102 and flows upwardly past the substrate carrier plate 112 and exhaust ring 220 and into the multiple exhaust ports 209.

As noted above, the chemical delivery module 203 supplies chemicals to the MOCVD chamber 102. Reactive gases (e.g., first and second precursor gases), carrier gases, purge gases, and cleaning gases may be supplied from the chemical delivery system through supply lines and into the chamber 102. The gases may be supplied through supply lines and into a gas mixing box where they are mixed together and delivered to the showerhead assembly 201. Generally, supply lines for each of the gases include shut-off valves that can be used to automatically or manually shut-off the flow of the gas into its associated line, and mass flow controllers or other types of controllers that measure the flow of gas or liquid through the supply lines. Supply lines for each of the gases may also include concentration monitors for monitoring precursor concentrations and providing real time feedback. Backpressure regulators may be included to control precursor gas concentrations. Valve switching control may be used for quick and accurate valve switching capability. Moisture sensors in the gas lines measure water levels and can provide feedback to the system software which in turn can provide warnings/alerts to operators. The gas lines may also be heated to prevent precursors and cleaning gases from condensing in the supply lines. Depending upon the process used some of the sources may be liquid rather than gas. When liquid sources are used, the chemical delivery module includes a liquid injection system or other appropriate mechanism (e.g., a bubbler) to vaporize the liquid. Vapor from the liquids is then usually mixed with a carrier gas as would be understood by a person of skill in the art.

The remote plasma system 226 can produce a plasma for selected applications, such as chamber cleaning or etching residue from a process substrate. Plasma species produced in the remote plasma system 226 from precursors supplied via an input line are sent via the central conduit 204D for dispersion through the showerhead 204 to the MOCVD chamber 102. Precursor gases for a cleaning application may include chlorine containing gases, fluorine containing gases, iodine containing gases, bromine containing gases, nitrogen containing gases, and/or other reactive elements. The remote plasma system 226 may also be adapted to deposit CVD layers flowing appropriate deposition precursor gases into remote plasma system 226 during a layer deposition process. In one embodiment, the remote plasma system 226 is used to deliver active chlorine species to the processing volume 208 for cleaning the interior of the MOCVD chamber 102.

The temperature of the walls of the MOCVD chamber 102 and surrounding structures, such as the exhaust passageway, may be further controlled by circulating a heat-exchange liquid through channels (not shown) in the walls of the chamber 102. The heat-exchange liquid can be used to heat or cool the chamber body 202 depending on the desired effect. For example, hot liquid may help maintain an even thermal gradient during a thermal deposition process, whereas a cool liquid may be used to remove heat from the system during an in-situ plasma process, or to limit formation of deposition products on the walls of the chamber. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

In one embodiment, during processing, a first precursor gas flows from the first processing gas manifold 204A in the showerhead 204 and a second precursor gas flows from the second processing gas manifold 204B formed in the showerhead 204 towards the surface of the substrates 240. As noted above, the first precursor gas and/or second precursor gas may comprise one or more precursor gases or process gasses as well as carrier gases and dopant gases which may be mixed with the precursor gases. The draw of the exhaust ports 209 may affect gas flow so that the process gases flow substantially tangential to the substrates 240 and may be uniformly distributed radially across the substrate deposition surfaces in a laminar flow. In one embodiment, the processing volume 208 may be maintained at a pressure of about 760 Torr down to about 80 Torr.

Exemplary showerheads that may be adapted to practice embodiments described herein are described in U.S. patent application Ser. No. 11/873,132, filed Oct. 16, 2007, now published as US 2009-0098276, entitled MULTI-GAS STRAIGHT CHANNEL SHOWERHEAD, U.S. patent application Ser. No. 11/873,141, filed Oct. 16, 2007, now published as US 2009-0095222, entitled MULTI-GAS SPIRAL CHANNEL SHOWERHEAD, and U.S. patent application Ser. No. 11/873,170, filed Oct. 16, 2007, now published as US 2009-0095221, entitled MULTI-GAS CONCENTRIC INJECTION SHOWERHEAD, all of which are incorporated by reference in their entireties. Other aspects of the MOCVD chamber 102 are described in U.S. patent application Ser. No. 12/023,520, filed Jan. 31, 2008, published as US 2009-0194024, and titled CVD APPARATUS, which is herein incorporated by reference in its entirety.

In summary, embodiments of the present invention include a showerhead assembly with separate inlets and manifolds for delivering separate processing gases into a processing volume of the chamber without mixing the gases prior to entering the processing volume. The showerhead includes a plurality of gas distribution devices disposed within a plurality of gas inlets for injecting one of the processing gases into and distributing it across a manifold for uniform delivery into the processing volume of the chamber. Each of the gas distribution devices preferably has a nozzle configured to evenly distribute the processing gas flowing therethrough while minimizing recirculation of the processing gas within the manifold. As a result, improved deposition uniformity is achieved on a plurality of substrates positioned in the processing volume of the processing chamber.

While the foregoing is directed to embodiments of the present invention, other and further embodiments of the invention may be devised without departing from the basic scope thereof, and the scope thereof is determined by the claims that follow. For example, certain embodiments of the showerhead assembly 201 do not have the manifold 204B and/or the manifold 204C.

The invention claimed is:

1. A showerhead assembly, comprising:
a top wall;
a showerhead;
a first gas manifold formed between the top wall and the showerhead, wherein a plurality of first gas conduits extend through the showerhead and fluidly coupling the first gas manifold to an exit surface of the showerhead and a central conduit is formed through the top wall and showerhead, wherein the central conduit is configured to flow a process gas out the exit surface of the showerhead while bypassing the first gas manifold;
a plurality of gas distribution devices formed in an array in the top wall about the central conduit, each gas distribution device fluidly interconnected by a plurality of second gas conduits, each gas distribution device having a center portion circumscribed by a cylindrical body, and
an annular gas passage that is formed between the center portion and the cylindrical body and that is in fluid communication with the first gas manifold, wherein each annular gas passage is ring shaped and tapers downwards to the first gas manifold, and wherein each gas distribution device is in fluid communication with each first gas conduit.

2. The assembly of claim 1, wherein each annular gas passage is formed through the gas distribution device and coupled to a ring shaped annular orifice formed in the first gas manifold.

3. The assembly of claim 2, wherein the central portion includes a frustoconical portion tapering to the first gas manifold and a distribution portion extending from the frustoconical portion within the first gas manifold.

4. The assembly of claim 3, wherein the distribution portion is a disc-shaped member and is positioned with respect to the cylindrical body portion such that gas flowing through the annular gas passage is distributed evenly through the ring shaped annular orifice.

5. The assembly of claim 4, wherein an outer surface of the frustoconical portion forms an angle with an upper surface of the distribution portion, and wherein the angle is between about 45 degrees and about 75 degrees.

6. The assembly of claim 1, wherein the showerhead has a second gas manifold formed in the showerhead and isolated from the first gas manifold and a temperature control manifold formed in the showerhead and isolated from the first and second gas manifolds, wherein the first gas conduits extend through the temperature control manifold.

7. The assembly of claim 6, further comprising a plurality of third gas conduits extending through the temperature control manifold and fluidly coupling the second gas manifold to the exit surface of the showerhead.

8. A substrate processing apparatus, comprising:
a chamber body;
a substrate support; and
a showerhead assembly, wherein a processing volume is defined by the chamber body, the substrate support, and the showerhead assembly, and wherein the showerhead assembly comprises:
a top wall;
a showerhead;
a first gas manifold formed between the top wall and the showerhead, wherein a central conduit is formed through the top wall and the showerhead, the central conduit configured to flow a process gas to an exit surface of the showerhead while bypassing the first gas manifold, and a plurality of first gas conduits extend through the showerhead and fluidly coupling the first gas manifold to the processing volume;
a plurality of gas distribution devices formed in an array in the top wall about the central conduit, wherein each gas distribution device is fluidly interconnected by a plurality of second gas conduits, each gas distribution device having a center portion circumscribed by a cylindrical body, and
an annular gas passage that is formed between the center portion and the cylindrical body and that is in fluid communication with the first gas manifold, wherein the annular gas passage is ring shaped and tapers downwards to the first gas manifold, and wherein each gas distribution device is in fluid communication with each first gas conduit.

9. The apparatus of claim 8, wherein each annular gas passage is formed through the gas distribution device and coupled to a ring shaped annular orifice formed in the first gas manifold.

10. The apparatus of claim 9, wherein the central portion includes a frustoconical portion tapering to the first gas manifold and a distribution portion extending from the frustoconical portion within the first gas manifold.

11. The apparatus of claim 10, wherein an outer surface of the frustoconical portion forms an angle with an upper surface of the distribution portion, and wherein the angle is between about 45 degrees and about 75 degrees.

12. The apparatus of claim 8, wherein the showerhead further has a second gas manifold formed therein and isolated from the first gas manifold, wherein the plurality of first gas conduits extend through the second gas manifold.

13. The apparatus of claim 12, further comprising a plurality of third gas conduits fluidly coupling the second gas manifold to the processing volume.

14. The apparatus of claim 13, wherein the plurality of gas distribution devices are coupled to a metal organic gas source, and wherein the second gas manifold is coupled to a nitrogen containing gas source.

15. A showerhead assembly, comprising:
a top wall;
a showerhead;
a first gas manifold formed between the top wall and the showerhead, wherein a plurality of first gas conduits extend through the showerhead and fluidly coupling the first gas manifold to an exit surface of the showerhead, wherein a central conduit is formed through the top wall and the showerhead, the central conduit configured to flow a process gas out the exit surface of the showerhead while bypassing the first gas manifold; and
a plurality of gas distribution devices formed in an array in the top wall about the central conduit, wherein each gas distribution device is fluidly interconnected by a plurality of second gas conduits, each gas distribution device comprising:
a cylindrical body having an upper surface and a lower surface;
a center portion circumscribed by and attached to the cylindrical body; and
an annular gas passage formed between an inside portion of the cylindrical body and the center portion, wherein the annular gas passage is ring shaped and tapers downwards from the upper surface to the lower surface, wherein each gas distribution device is in fluid communication with each first gas conduit.

* * * * *

UNITED STATES PATENT AND TRADEMARK OFFICE
CERTIFICATE OF CORRECTION

| | |
|---|---|
| PATENT NO. | : 10,130,958 B2 |
| APPLICATION NO. | : 12/856747 |
| DATED | : November 20, 2018 |
| INVENTOR(S) | : Alexander Tam et al. |

Page 1 of 1

It is certified that error appears in the above-identified patent and that said Letters Patent is hereby corrected as shown below:

On the Title Page

Item (75), in Column 1, in "Inventor", Line 2, delete "Sane Jose," and insert -- San Jose, --, therefor.

In the Specification

In Column 4, Line 9, delete "($C_2$)" and insert -- ($O_2$) --, therefor.

Signed and Sealed this
Eighth Day of January, 2019

Andrei Iancu
*Director of the United States Patent and Trademark Office*